United States Patent
Yang et al.

(10) Patent No.: US 11,150,284 B2
(45) Date of Patent: Oct. 19, 2021

(54) FREQUENCY REGULATION METHOD AND APPARATUS

(71) Applicant: Huawei Technologies Co., Ltd., Guangdong (CN)

(72) Inventors: Rui Yang, Shanghai (CN); Zhiwei Wu, Shanghai (CN); Wei Mo, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 339 days.

(21) Appl. No.: 16/137,126

(22) Filed: Sep. 20, 2018

(65) Prior Publication Data

US 2019/0025357 A1    Jan. 24, 2019

Related U.S. Application Data

(63) Continuation of application No. PCT/CN2016/102460, filed on Oct. 18, 2016.

(30) Foreign Application Priority Data

Mar. 21, 2016 (CN) .......................... 201610162367.2

(51) Int. Cl.
*G01R 27/18* (2006.01)
*G01R 27/02* (2006.01)
(Continued)

(52) U.S. Cl.
CPC .......... *G01R 27/18* (2013.01); *G01R 27/025* (2013.01); *G01R 27/04* (2013.01); *G01R 35/005* (2013.01)

(58) Field of Classification Search
CPC .... G01R 27/18; G01R 35/005; G01R 27/025; G01R 27/04; G01R 1/28
See application file for complete search history.

(56) References Cited

U.S. PATENT DOCUMENTS 5,450,328 A * 9/1995 Janke ..................... G01R 27/18
324/509
6,471,020 B1 * 10/2002 Hernandez .............. B60L 53/14
191/2

(Continued)

FOREIGN PATENT DOCUMENTS

CN      101379669 A     3/2009
CN      101997611 A     3/2011
(Continued)

*Primary Examiner* — Jeff W Natalini
(74) *Attorney, Agent, or Firm* — Conley Rose, P.C.

(57) ABSTRACT

A frequency regulation method and apparatus is applied to an insulation impedance detection apparatus in a direct current power system, and relates to the field of security monitoring technologies of a direct current electrical system. The method includes: collecting sampling voltages at a sampling point for at least three time points; determining a voltage frequency regulation manner based on the sampling voltages, obtained through sampling, at the at least three time points; and then regulating a voltage frequency of a power supply according to the determined voltage frequency regulation manner. The voltage frequency of the power supply can be regulated based on the at least three sampling voltages obtained through sampling. Therefore, the insulation impedance detection apparatus reduces insulation impedance detection duration while ensuring accuracy of measured insulation impedance.

20 Claims, 7 Drawing Sheets

(51) Int. Cl.
*G01R 27/04* (2006.01)
*G01R 35/00* (2006.01)

(56) References Cited

U.S. PATENT DOCUMENTS

| | | | |
|---|---|---|---|
| 6,952,103 B2 | 10/2005 | Herb et al. | |
| 8,421,467 B2 | 4/2013 | Klijn et al. | |
| 2009/0002903 A1 | 1/2009 | Uchida | |
| 2010/0176794 A1* | 7/2010 | Tsen | G01R 19/2503 324/120 |
| 2012/0119754 A1 | 5/2012 | Brenk et al. | |
| 2012/0126839 A1* | 5/2012 | Schaefer | G01R 27/18 324/750.01 |
| 2012/0280697 A1 | 11/2012 | Morimoto | |
| 2013/0106437 A1 | 5/2013 | Herraiz et al. | |
| 2014/0097854 A1 | 4/2014 | Hermeling et al. | |
| 2014/0114591 A1 | 4/2014 | Broeckmann et al. | |
| 2014/0223218 A1* | 8/2014 | Cook | G06F 1/3206 713/340 |
| 2015/0226782 A1 | 8/2015 | Cordesses et al. | |
| 2016/0204651 A1* | 7/2016 | Pancheri | H02J 9/061 307/23 |

FOREIGN PATENT DOCUMENTS

| | | |
|---|---|---|
| CN | 102426320 A | 4/2012 |
| CN | 101726674 B | 7/2012 |
| CN | 202886514 U | 4/2013 |
| CN | 103076497 A | 5/2013 |
| CN | 103091557 A | 5/2013 |
| CN | 103499744 A | 1/2014 |
| CN | 103547932 A | 1/2014 |
| CN | 104133114 A | 11/2014 |
| CN | 104155525 A | 11/2014 |
| CN | 104204823 A | 12/2014 |
| CN | 104635057 A | 5/2015 |
| CN | 104865506 A | 8/2015 |
| DE | 10106200 C1 | 9/2002 |
| EP | 0654673 A1 | 5/1995 |
| JP | S61196178 A | 8/1986 |
| JP | H09196981 A | 7/1997 |
| JP | 2002139530 A | 5/2002 |
| WO | 2012029214 A1 | 3/2012 |
| WO | 2012160118 A1 | 11/2012 |

* cited by examiner

FREQUENCY REGULATION METHOD AND APPARATUS

CROSS-REFERENCE TO RELATED APPLICATIONS

This application is a continuation of International Application No. PCT/CN2016/102460 filed on Oct. 18, 2016, which claims priority to Chinese Patent Application No. 201610162367.2 filed on Mar. 21, 2016. The disclosures of the aforementioned applications are hereby incorporated by reference in their entireties.

TECHNICAL FIELD

The present application relates to the field of security monitoring technologies of a direct current electrical system, and in particular, to a frequency regulation method and apparatus.

BACKGROUND

Currently, systems such as a photovoltaic power generation system and a pure electric vehicle have a direct current power system that provides a relatively high direct current voltage. To avoid an electric leakage from the direct current power system during usage or normal maintenance of the direct current power system, a corresponding insulation level needs to be maintained between a high voltage end of the direct current power system and a reference ground. A parameter for measuring the insulation level of the direct current power system is an insulation impedance value between the high voltage end of the direct current power system and the reference ground. The impedance value directly reflects an insulation status in the direct current power system.

During insulation impedance value measurement, when parasitic capacitance between the high voltage end of the direct current power system and the reference ground can be ignored, according to an existing method, an insulation impedance value can be obtained in a relatively quick manner, and precision of the obtained insulation impedance value is relatively high. However, in an actual system, being affected by wiring and layout of the direct current power system and an electric device connected in the direct current power system, the parasitic capacitance usually is relatively large, and cannot be ignored. The parasitic capacitance existing between the high voltage end of the direct current power system and the reference ground may affect accuracy of insulation impedance obtained through calculation by using a voltage at a sampling point.

In the prior art, a voltage frequency injected in an insulation impedance detection system is set to a relatively small value, so as to reduce impact of the parasitic capacitance on the accuracy of the insulation impedance. Although the accuracy of the measured insulation impedance is improved, insulation impedance detection duration is greatly prolonged.

SUMMARY

The present disclosure provides a frequency regulation method and apparatus, so as to reduce insulation impedance detection duration while ensuring accuracy of measured insulation impedance.

According to a first aspect, a frequency regulation method is provided, and is applied to an insulation impedance detection apparatus in a direct current power system, where the method includes:

collecting sampling voltages at a sampling point at at least three time points; determining a voltage frequency regulation manner based on at least three sampling voltages obtained through sampling; and regulating a voltage frequency of a power supply in the insulation impedance detection apparatus according to the determined voltage frequency regulation manner.

On a basis of the first aspect, optionally, when the at least three voltages obtained through sampling meet a first function relationship, it is determined that the voltage frequency regulation manner is maintaining the voltage frequency unchanged; when the at least three voltages obtained through sampling do not meet the first function relationship but meet a second function relationship, it is determined that the voltage frequency regulation manner is increasing the voltage frequency by a specified first step; or when the at least three voltages obtained through sampling do not meet the first function relationship but meet a third function relationship, it is determined that the voltage frequency regulation manner is reducing the voltage frequency by a specified second step.

On the basis of the first aspect, optionally, sampling voltages at the sampling point at three time points are collected, to be specific, a first sampling voltage at a first time point, a second sampling voltage at a second time point, and a third sampling voltage at a third time point are collected.

On the basis of the first aspect, optionally, a voltage cycle of the power supply in the insulation impedance detection apparatus is T; and a first sampling voltage at the sampling point at a time point zero of the voltage cycle, a second sampling voltage at the sampling point at a time point T/4 of the voltage cycle, and a third sampling voltage at the sampling point at a time point T/2 of the voltage cycle are collected; or a first sampling voltage at the sampling point at a time point T/2 of the voltage cycle, a second sampling voltage at the sampling point at a time point 3T/4 of the voltage cycle, and a third sampling voltage at the sampling point at a time point T of the voltage cycle are collected.

On the basis of the first aspect, optionally, the first function relationship is $$\frac{1}{2}(|V_3|+|V_1|)+\frac{k_2}{2}||V_3|-|V_1||<|V_2|<\frac{1}{2}(|V_3|+|V_1|)+\frac{k_1}{2}||V_3|-|V_1||;$$

the second function relationship is $$|V_2|>\frac{1}{2}(|V_3|+|V_1|)+\frac{k_1}{2}||V_3|-|V_1||;$$

and the third function relationship is $$|V_2|<\frac{1}{2}(|V_3|+|V_1|)+\frac{k_2}{2}||V_3|-|V_1||,$$

where $V_1$ is the first sampling voltage, $V_2$ is the second sampling voltage, $V_3$ is the third sampling voltage, $k_1 \in (0,1)$, $k_2 \in (0,1)$, and $k_2 < k_1$.

On the basis of the first aspect, optionally, the first function relationship is $|V_3|-|V_2|>\Delta V_a$ and $|V_2|-|V_1|>\Delta V_b$; the second function relationship is $|V_3|-|V_2|<\Delta V_a$; and the third function relationship is $|V_2|-|V_0|<\Delta V_b$, where $V_1$ is the first sampling voltage, $V_2$ is the second sampling voltage, $V_3$ is the third sampling voltage, and $\Delta V_a$ and $\Delta V_b$ are constants that are not less than an absolute value of a detection error in voltage sampling.

According to a second aspect, a frequency regulation apparatus is provided, applied to an insulation impedance detection apparatus in a direct current power system, and including: a sampling unit, configured to collect sampling voltages at a sampling point at at least three time points; a processing unit, configured to determine a voltage frequency regulation manner based on at least three sampling voltages obtained through sampling; and a regulation unit, configured to regulate a voltage frequency of a power supply in the insulation impedance detection apparatus according to the determined voltage frequency regulation manner.

On a basis of the second aspect, optionally, the processing unit is specifically configured to: when the at least three sampling voltages obtained through sampling meet a first function relationship, determine that the voltage frequency regulation manner is maintaining the voltage frequency unchanged; when the at least three sampling voltages obtained through sampling do not meet the first function relationship but meet a second function relationship, determine that the voltage frequency regulation manner is increasing the voltage frequency by a specified first step; or when the at least three sampling voltages obtained through sampling do not meet the first function relationship but meet a third function relationship, determine that the voltage frequency regulation manner is reducing the voltage frequency by a specified second step.

On the basis of the second aspect, optionally, the sampling unit is specifically configured to collect sampling voltages at the sampling point at three time points: a first sampling voltage at a first time point, a second sampling voltage at a second time point, and a third sampling voltage at a third time point.

On the basis of the second aspect, optionally, a voltage cycle of the power supply in the insulation impedance detection apparatus is T; and the sampling unit is specifically configured to: collect a first sampling voltage at the sampling point at a time point zero of the voltage cycle, a second sampling voltage at the sampling point at a time point T/4 of the voltage cycle, and a third sampling voltage at the sampling point at a time point T/2 of the voltage cycle; or collect a first sampling voltage at the sampling point at a time point T/2 of the voltage cycle, a second sampling voltage at the sampling point at a time point 3T/4 of the voltage cycle, and a third sampling voltage at the sampling point at a time point T of the voltage cycle.

On the basis of the second aspect, optionally, the first function relationship is $$\frac{1}{2}(|V_3|+|V_1|)+\frac{k_2}{2}||V_3|-|V_1||<|V_2|<\frac{1}{2}(|V_3|+|V_1|)+\frac{k_1}{2}||V_3|-|V_1||;$$

the second function relationship is $$|V_2|>\frac{1}{2}(|V_3|+|V_1|)+\frac{k_1}{2}||V_3|-|V_1||;$$

and the third function relationship is $$|V_2|<\frac{1}{2}(|V_3|+|V_1|)+\frac{k_2}{2}||V_3|-|V_1||,$$

where $V_1$ is the first sampling voltage, $V_2$ is the second sampling voltage, $V_3$ is the third sampling voltage, $k_1 \in (0,1)$, $k_2 \in (0,1)$, and $k_2 < k_1$.

On the basis of the second aspect, optionally, the first function relationship is $|V_3|-|V_2|>\Delta V_a$ and $|V_2|-|V_1|>\Delta V_b$; the second function relationship is $|V_3|-|V_2|<\Delta V_a$; and the third function relationship is $|V_2|-|V_0|<\Delta V_b$, where $V_1$ is the first sampling voltage, $V_2$ is the second sampling voltage, $V_3$ is the third sampling voltage, and $\Delta V_a$ and $\Delta V_b$ are constants that are not less than an absolute value of a detection error in voltage sampling.

According to a third aspect, a frequency regulation apparatus is provided, applied to an insulation impedance detection apparatus in a direct current power system, and including a processor and a memory. The processor is configured to: collect sampling voltages at a sampling point at at least three time points; store at least three sampling voltages obtained through sampling into the memory; determine a voltage frequency regulation manner based on the at least three sampling voltages obtained through sampling; and regulate a voltage frequency of a power supply in the insulation impedance detection apparatus according to the determined voltage frequency regulation manner.

On a basis of the third aspect, optionally, the processor is specifically configured to: when the at least three sampling voltages obtained through sampling meet a first function relationship, determine that the voltage frequency regulation manner is maintaining the voltage frequency unchanged; when the at least three sampling voltages obtained through sampling do not meet the first function relationship but meet a second function relationship, determine that the voltage frequency regulation manner is increasing the voltage frequency by a specified first step; or when the at least three sampling voltages obtained through sampling do not meet the first function relationship but meet a third function relationship, determine that the voltage frequency regulation manner is reducing the voltage frequency by a specified second step.

On the basis of the third aspect, optionally, the processor is specifically configured to collect sampling voltages at the sampling point at three time points: a first sampling voltage at a first time point, a second sampling voltage at a second time point, and a third sampling voltage at a third time point.

On the basis of the third aspect, optionally, a voltage cycle of the power supply in the insulation impedance detection apparatus is T; and the processor is specifically configured to: collect a first sampling voltage at the sampling point at a time point zero of the voltage cycle, a second sampling voltage at the sampling point at a time point T/4 of the voltage cycle, and a third sampling voltage at the sampling point at a time point T/2 of the voltage cycle, or collect a first sampling voltage at the sampling point at a time point T/2 of the voltage cycle, a second sampling voltage at the sampling point at a time point 3T/4 of the voltage cycle, and a third sampling voltage at the sampling point at a time point T of the voltage cycle; and store the first sampling voltage, the second sampling voltage, and the third sampling voltage into the memory.

On the basis of the third aspect, optionally, the first function relationship is $$\frac{1}{2}(|V_3|+|V_1|)+\frac{k_2}{2}||V_3|-|V_1|| < |V_2| < \frac{1}{2}(|V_3|+|V_1|)+\frac{k_1}{2}||V_3|-|V_1||;$$

the second function relationship is $$|V_2| > \frac{1}{2}(|V_3|+|V_1|)+\frac{k_1}{2}||V_3|-|V_1||;$$

and the third function relationship is $$|V_2| < \frac{1}{2}(|V_3|+|V_1|)+\frac{k_2}{2}||V_3|-|V_1||,$$

where $V_1$ is the first sampling voltage, $V_2$ is the second sampling voltage, $V_3$ is the third sampling voltage $k_1 \in (0,1)$, $k_2 \in (0,1)$, and $k_2 < k_1$.

On the basis of the third aspect, optionally, the first function relationship is $|V_3|-|V_2|>\Delta V_a$ and $|V_2|-|V_1|>\Delta V_b$; the second function relationship is $|V_3|-|V_2|<\Delta V_a$; and the third function relationship is $|V_2|-|V_0|<\Delta V_b$, where $V_1$ is the first sampling voltage, $V_2$ is the second sampling voltage, $V_3$ is the third sampling voltage, and $\Delta V_a$ and $\Delta V_b$ are constants that are not less than an absolute value of a detection error in voltage sampling.

A change of parasitic capacitance can affect values of the at least three sampling voltages obtained through sampling. In addition, in embodiments of the present disclosure, the voltage frequency regulation manner of the power supply can be determined based on the at least three sampling voltages obtained through sampling, and the voltage frequency of the power supply can be regulated according to the determined voltage frequency regulation manner, so that an obtained voltage cycle of the power supply is approximately equal to an insulation time constant of the insulation detection apparatus. Therefore, precision of insulation impedance obtained by using sampling voltages at a regulated voltage frequency is relatively high, insulation impedance detection duration is reduced, and the voltage frequency of the power supply can be dynamically regulated when the parasitic capacitance changes, thereby avoiding a problem in the prior art that in order to improve precision of insulation impedance calculation, the insulation impedance detection duration is prolonged by setting the voltage frequency of the power supply to a relatively small value.

BRIEF DESCRIPTION OF THE DRAWINGS

FIG. 4(*b*) is a schematic diagram of a voltage at a sampling point when a voltage of a power supply is a rectangular wave according to an embodiment of the present disclosure;

FIG. 8(*b*) shows another insulation impedance detection apparatus, in a direct current power system, to which an embodiment of the present disclosure may be applied;

DETAILED DESCRIPTION

To make the objectives, technical solutions, and advantages of the present disclosure clearer, the following further describes the present disclosure in detail with reference to the accompanying drawings.

Figure 1:
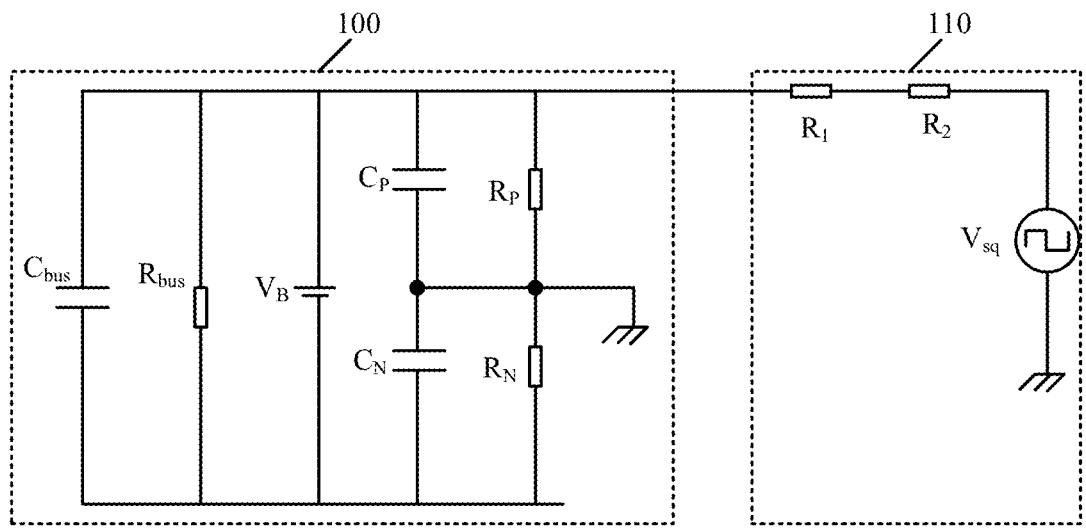
FIG. 1 shows an insulation impedance detection apparatus in a direct current power system in the prior art.

A frequency regulation method according to an embodiment of the present disclosure may be applied to an insulation impedance detection apparatus in a direct current power system. An insulation impedance detection apparatus in a direct current power system is shown in FIG. 1. Depicted is a device (or part) 100 under detection in the insulation impedance detection apparatus, and a detection part 110 in the insulation impedance detection apparatus. Device 100 includes a direct current power supply $V_B$, an equivalent resistor Rbus between a positive electrode and a negative electrode of the direct current power supply, a capacitor Cbus between the positive electrode and the negative electrode, a resistor $R_p$ between the positive electrode and a reference ground, a capacitor $C_p$ between the positive electrode and the reference ground, a resistor Rn between the negative electrode and the reference ground, and a capacitor Rn between the negative electrode and the reference ground. Detection part 110 includes auxiliary detection resistors $R_1$ and $R_2$ and a power supply $V_{sq}$.

Figure 2:
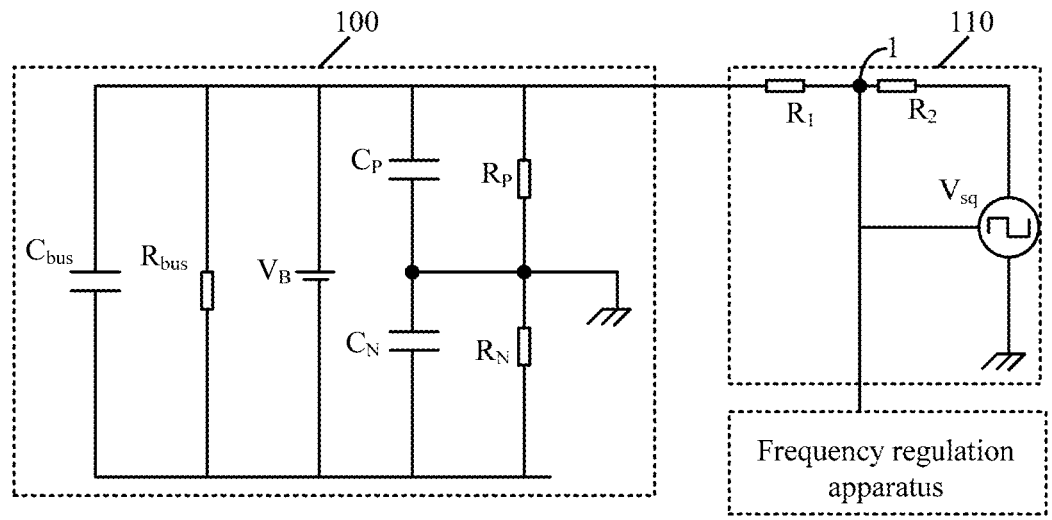
FIG. 2 is a schematic diagram of a manner of connection between a frequency regulation apparatus and an insulation impedance detection apparatus according to an embodiment of the present disclosure.

A connection manner between a frequency regulation apparatus and the insulation impedance detection apparatus in this embodiment of the present disclosure is shown in FIG. 2.

FIG. 1 is used as an example to describe the frequency regulation method in this embodiment of the present disclosure.

Figure 3:
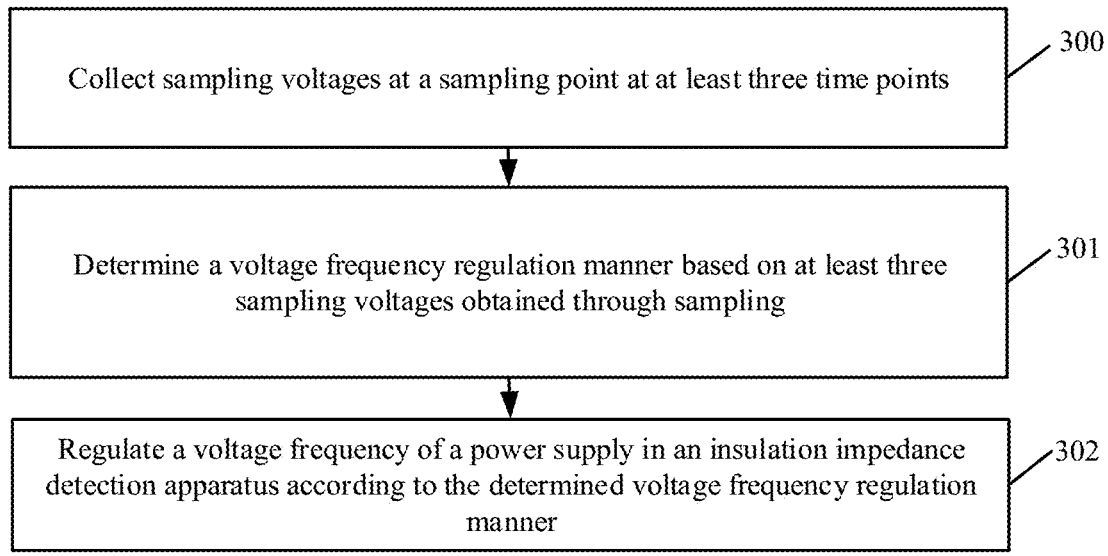
FIG. 3 is a schematic flowchart of a frequency regulation method according to an embodiment of the present disclosure.

As shown in FIG. 3, the frequency regulation method in this embodiment of the present disclosure includes the following steps.

Step 300: Collect sampling voltages at a sampling point at at least three time points.

It should be noted that the sampling point may be set depending on a requirement. FIG. 1 is used as an example. A location between R1 and R2 may be used as the sampling point, or two ends of R2 may be used as sampling points, provided that a voltage at the sampling point being capable of varying with a change of parasitic capacitance can be reflected. Sampling time points of the sampling point are at least three time points that are set depending on an actual requirement. Sampling voltages at three time points are collected, for example, a first sampling voltage at a first time point, a second sampling voltage at a second time point, and a third sampling voltage at a third time point are collected.

To more conveniently describe a relationship between a voltage frequency of a power supply and an insulation time constant by using a relationship between the first sampling voltage, the second sampling voltage, and the third sampling voltage, when a voltage cycle of the power supply in the insulation impedance detection apparatus is T, a first sampling voltage at the sampling point at a time point zero of the voltage cycle, a second sampling voltage at the sampling point at a time point T/4 of the voltage cycle, and a third sampling voltage at the sampling point at a time point T/2 of the voltage cycle are collected, or a first sampling voltage at the sampling point at a time point T/2 of the voltage cycle, a second sampling voltage at the sampling point at a time point 3T/4 of the voltage cycle, and a third sampling voltage at the sampling point at a time point T of the voltage cycle are collected.

Step 301: Determine a voltage frequency regulation manner based on at least three sampling voltages obtained through sampling.

Specifically, an optional implementation is determining whether the at least three sampling voltages obtained through sampling meet a first function relationship; and if it is determined that the at least three sampling voltages obtained through sampling meet a first function relationship, the voltage frequency regulation manner is maintaining the voltage frequency unchanged;

when it is determined that the at least three sampling voltages obtained through sampling do not meet the first function relationship but meet a second function relationship, it is determined that the voltage frequency regulation manner is increasing the voltage frequency by a specified first step; or when it is determined that the at least three sampling voltages obtained through sampling do not meet the first function relationship but meet a third function relationship, it is determined that the voltage frequency regulation manner is reducing the voltage frequency by a specified second step.

It should be noted that the first step and the second step may be set depending on an actual requirement, and the first step and the second step may be the same or may be different.

Specifically, when the first sampling voltage at the sampling point at the time point zero of the voltage cycle, the second sampling voltage at the sampling point at the time point T/4 of the voltage cycle, and the third sampling voltage at the sampling point at the time point T/2 of the voltage cycle are collected, or when the first sampling voltage at the sampling point at the time point T/2 of the voltage cycle, the second sampling voltage at the sampling point at the time point 3T/4 of the voltage cycle, and the third sampling voltage at the sampling point at the time point T of the voltage cycle are collected, if the first function relationship is $$\frac{1}{2}(|V_3|+|V_1|)+\frac{k_2}{2}||V_3|-|V_1|| < |V_2| < \frac{1}{2}(|V_3|+|V_1|)+\frac{k_1}{2}||V_3|-|V_1||,$$

the second function relationship is $$|V_2| > \frac{1}{2}(|V_3|+|V_1|)+\frac{k_1}{2}||V_3|-|V_1||,$$

and the third function relationship is $$|V_2| < \frac{1}{2}(|V_3|+|V_1|)+\frac{k_2}{2}||V_3|-|V_1||,$$

where $V_1$ is the first sampling voltage, $V_2$ is the second sampling voltage, $V_3$ is the third sampling voltage, $k_1 \in (0,1)$, $k_2 \in (0,1)$, and $k_2 < k_1$; or if the first function relationship is $|V_3|-|V_2| > \Delta V_a$ and $|V_2|-|V_1| < \Delta V_b$, the second function relationship is $|V_3|-|V_2| < \Delta V_a$, and the third function relationship is $|V_2|-|V_0| < \Delta V_b$, where $V_1$ is the first sampling voltage, $V_2$ is the second sampling voltage, $V_3$ is the third sampling voltage, and $\Delta V_a$ and $\Delta V_b$ are constants that are not less than an absolute value of a detection error in voltage sampling.

Step 302: Regulate a voltage frequency of a power supply in an insulation impedance detection apparatus according to the determined voltage frequency regulation manner.

The frequency regulation method in this embodiment of the present disclosure may be performed by a separate microprocessor, may be performed by a microprocessor combined with an analog circuit, or may be separately performed by an analog circuit.

Figure 4A:
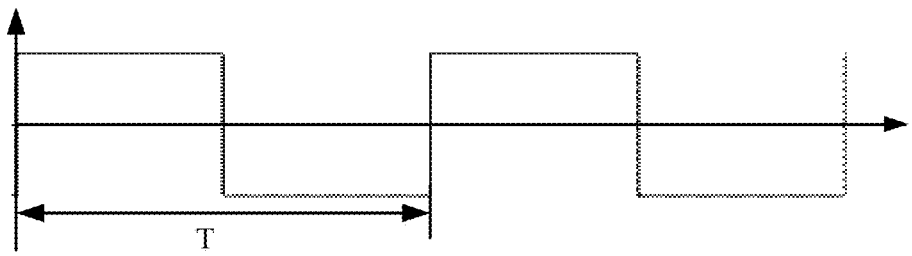
FIG. 4(*a*) is a schematic diagram of a voltage of a power supply when the voltage of the power supply is a rectangular wave according to an embodiment of the present disclosure.
Figure 4B:
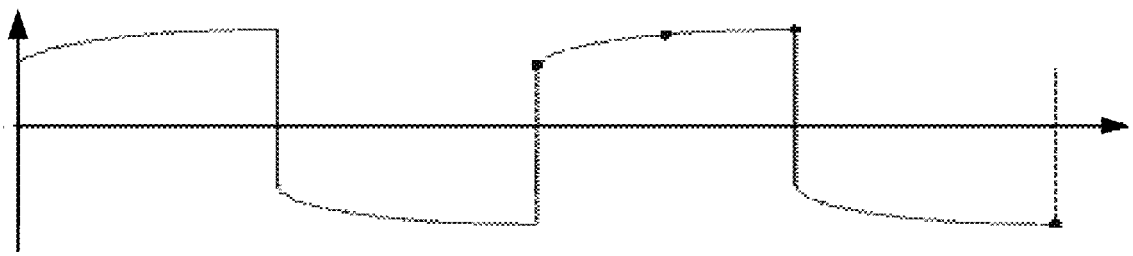

When a voltage of the power supply Vsq is a rectangular wave voltage, and a voltage cycle of the power supply is T, the sampling point is set at a location 1 between $R_1$ and $R_2$ in FIG. 1, the first time point is a time point zero of the voltage cycle of the power supply Vsq, the second time point is a time point T/4 of the voltage cycle of the power supply Vsq, and the third time point is a time point T/2 of the voltage cycle of the power supply $V_{sq}$. FIG. 4(a) and FIG. 4(b) are used as an example for description. FIG. 4(a) is a schematic diagram of a voltage waveform of the power supply. FIG. 4(b) is a voltage waveform diagram of a sampling point.

When an insulation impedance $R_p$ is obtained through calculation by using the first sampling voltage $V_1$, the second sampling voltage $V_2$, and the third sampling voltage $V_3$, to make $R_p$ obtained through calculation more accurate, an appropriate voltage frequency of a power supply $V_{sq}$ needs to be selected, so that a voltage half cycle of the power supply $V_{sq}$ is approximately equal to the insulation time constant.

Figure 5A:
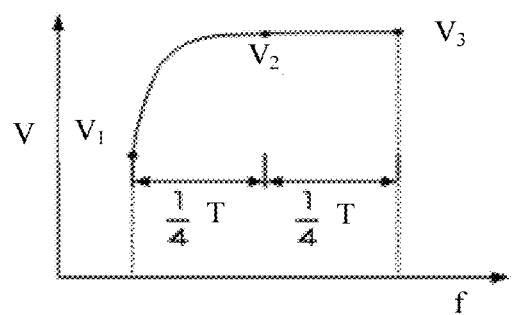
FIG. 5(*a*), FIG. 5(*b*), and FIG. 5(*c*) are schematic diagrams of distribution of a first sampling voltage, a second sampling voltage, and a third sampling voltage in different cases.
Figure 5B:
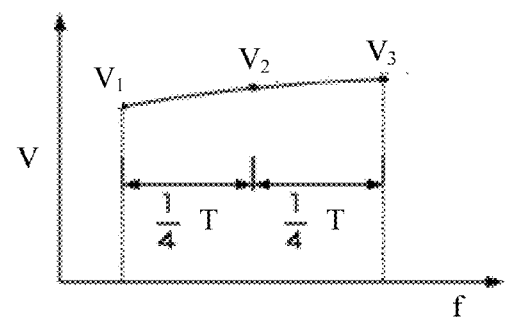
Figure 5C:
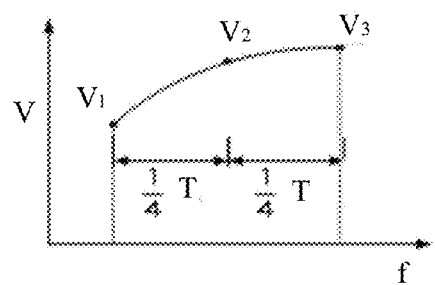

It is relatively difficult to regulate the voltage frequency of the power supply by directly measuring the insulation time constant. However, when a relationship between the voltage half cycle of the power supply and the insulation time constant affects the relationship between the sampling voltages $V_1$, $V_2$, and $V_3$, the relationship between $V_1$, $V_2$, and $V_3$ may indirectly reflect the relationship between the voltage half cycle of the power supply and the insulation time constant. Specifically, when the voltage half cycle of the power supply is far greater than the insulation time constant, a waveform graph of the sampling voltages $V_1$, $V_2$, and $V_3$ at the sampling point is shown in FIG. 5(a). In this case, $V_2$ is approximately equal to $V_3$. When the voltage half cycle of the power supply is far less than the insulation time constant, a waveform graph of the sampling voltages $V_1$, $V_2$, and $V_3$ at the sampling point is shown in FIG. 5(b). In this case, $V_1$ is approximately an average value of $V_2$ and $V_3$. When the voltage half cycle of the power supply is approximately equal to the insulation time constant, a waveform graph of the sampling voltages $V_1$, $V_2$, and $V_3$ at the sampling point is shown in FIG. 5(c).

Therefore, the voltage frequency of the power supply may be regulated based on distribution of the sampling voltages $V_1$, $V_2$, and $V_3$.

Figure 6:
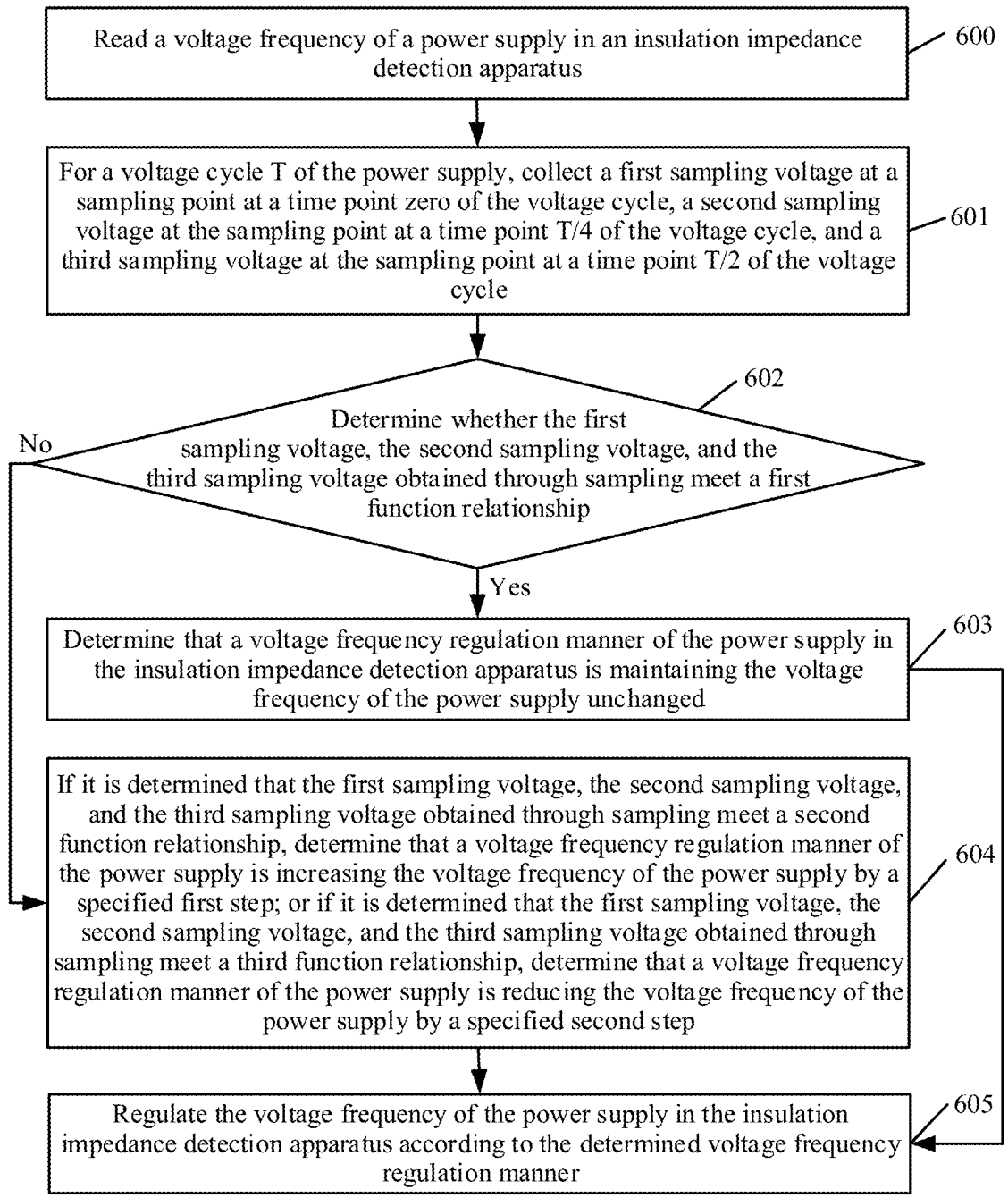
FIG. 6 is a schematic flowchart of a frequency regulation method according to an embodiment of the present disclosure.

When a sampling point is set at a location 1 between R1 and R2 shown in FIG. 1, and a voltage cycle of a power supply is T, as shown in FIG. 6, a frequency regulation method in an embodiment of the present disclosure includes the following steps.

Step 600: Read a voltage frequency of a power supply in an insulation impedance detection apparatus.

Step 601: For a voltage cycle T of the power supply, collect a first sampling voltage $V_1$ at a sampling point at a time point zero of the voltage cycle, a second sampling voltage $V_2$ at the sampling point at a time point T/4 of the voltage cycle, and a third sampling voltage $V_3$ at the sampling point at a time point T/2 of the voltage cycle.

Step 602: Determine whether $V_1$, $V_2$, and $V_3$ obtained through sampling meet a first function relationship $$\frac{1}{2}(|V_3|+|V_1|) + \frac{k_2}{2}||V_3|-|V_1|| < |V_2| < \frac{1}{2}(|V_3|+|V_1|) + \frac{k_1}{2}||V_3|-|V_1||,$$

where $k_1 \in (0,1)$, $k_2 \in (0,1)$, and $k_2 < k_1$; and if $V_1$, $V_2$, and $V_3$ obtained through sampling meet the first function relationship $$\frac{1}{2}(|V_3|+|V_1|) + \frac{k_2}{2}||V_3|-|V_1|| < |V_2| < \frac{1}{2}(|V_3|+|V_1|) + \frac{k_1}{2}||V_3|-|V_1||,$$

perform step 603, or if $V_1$, $V_2$, and $V_3$ obtained through sampling do not meet the first function relationship $$\frac{1}{2}(|V_3|+|V_1|) + \frac{k_2}{2}||V_3|-|V_1|| < |V_2| < \frac{1}{2}(|V_3|+|V_1|) + \frac{k_1}{2}||V_3|-|V_1||,$$

perform step 604.

Step 603: Determine that a voltage frequency regulation manner of the power supply in the insulation impedance detection apparatus is maintaining the voltage frequency of the power supply unchanged, and perform step 605.

Step 604: If it is determined that $V_1$, $V_2$, and $V_3$ obtained through sampling meet a second function relationship $$|V_2| > \frac{1}{2}(|V_3|+|V_1|) + \frac{k_1}{2}||V_3|-|V_1||,$$

determine that a voltage frequency regulation manner of the power supply is increasing the voltage frequency of the power supply by a specified first step; or if it is determined that $V_1$, $V_2$, and $V_3$ obtained through sampling meet a third function relationship $$|V_2| < \frac{1}{2}(|V_3|+|V_1|) + \frac{k_2}{2}||V_3|-|V_1||,$$

determine that a voltage frequency regulation manner of the power supply is reducing the voltage frequency of the power supply by a specified second step.

Step 605: Regulate the voltage frequency of the power supply in the insulation impedance detection apparatus according to the determined voltage frequency regulation manner.

When a first sampling voltage $V_1$ at the sampling point at a time point T/2 of the voltage cycle, a second sampling voltage $V_2$ at the sampling point at a time point 3T/4 of the voltage cycle, and a third sampling voltage $V_3$ at the sampling point at a time point T of the voltage cycle are collected, steps of a frequency regulation method are similar to steps shown in FIG. 6, and details are not described herein again.

It should be noted that the first step and the second step may be set depending on an actual requirement, and the first step and the second step may be the same or may be different.

Figure 7:
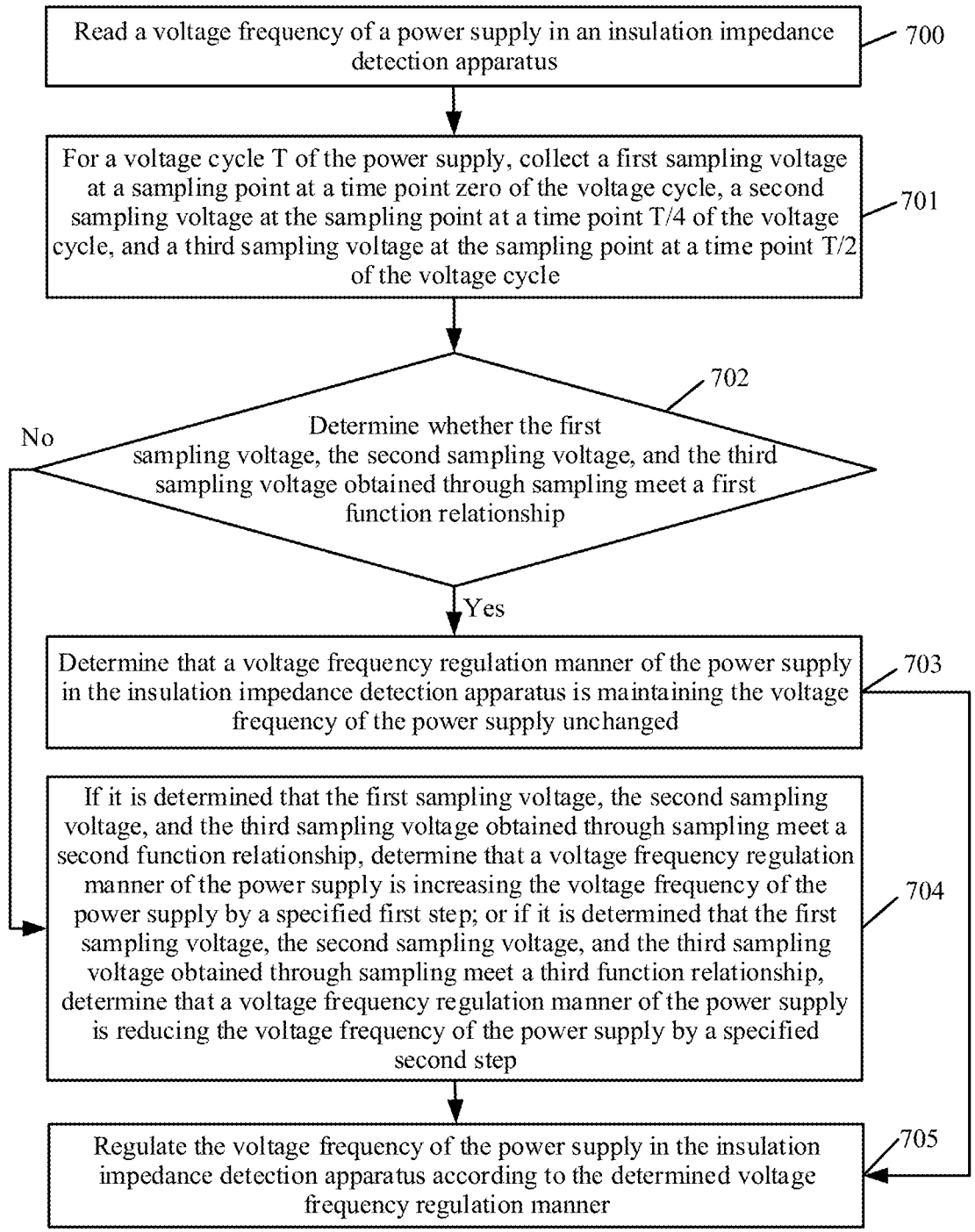
FIG. 7 is a schematic flowchart of a frequency regulation method according to an embodiment of the present disclosure.

An embodiment of the present disclosure further provides a frequency regulation method. As shown in FIG. 7, the method includes the following steps.

Step 700: Read a voltage frequency of a power supply in an insulation impedance detection apparatus.

Step 701: For a voltage cycle T of the power supply, collect a first sampling voltage $V_1$ at a sampling point at a time point zero of the voltage cycle, a second sampling voltage $V_2$ at the sampling point at a time point T/4 of the voltage cycle, and a third sampling voltage $V_3$ at the sampling point at a time point T/2 of the voltage cycle.

Step 702: Determine whether $V_1$, $V_2$, and $V_3$ obtained through sampling meet a preset first function relationship $|V_3|-|V_2|>\Delta V_a$ and $|V_2|-|V_1|>\Delta V_b$, where $\Delta V_a$ and $\Delta V_b$ are constants that are not less than an absolute value of a detection error in voltage sampling; and if $V_1$, $V_2$, and $V_3$ obtained through sampling meet the first function relationship $|V_3|-|V_2|>\Delta V_a$ and $|V_2|-|V_1|>\Delta V_b$, perform step 703, or if $V_1$, $V_2$, and $V_3$ obtained through sampling do not meet the first function relationship $|V_3|-|V_2|>\Delta V_a$ and $|V_2|-|V_1|>\Delta V_b$, perform step 704.

Step 703: Determine that a voltage frequency regulation manner of the power supply in the insulation impedance detection apparatus is maintaining the voltage frequency of the power supply unchanged, and perform step 705.

Step 704: If it is determined that $V_1$, $V_2$, and $V_3$ obtained through sampling meet a second function relationship $|V_3|-|V_2|>\Delta V_a$ determine that a voltage frequency regulation manner of the power supply is increasing the voltage frequency of the power supply by a specified first step; or if it is determined that $V_1$, $V_2$, and $V_3$ obtained through sampling meet a third function relationship $|V_2|-|V_0|<\Delta V_b$, determine that a voltage frequency regulation manner of the power supply is reducing the voltage frequency of the power supply by a specified second step.

Step 705: A frequency regulation apparatus regulates the voltage frequency of the power supply in the insulation impedance detection apparatus according to the determined voltage frequency regulation manner.

When a first sampling voltage $V_1$ at the sampling point at a time point T/2 of the voltage cycle, a second sampling voltage $V_2$ at the sampling point at a time point 3T/4 of the voltage cycle, and a third sampling voltage $V_3$ at the sampling point at a time point T of the voltage cycle are collected, steps of a frequency regulation method are similar to steps shown in FIG. 7, and details are not described herein again.

In addition, a frequency regulation method used when sampling points are at two ends of R2 shown in FIG. 1, that is, a sampling voltage is a voltage between the two ends of R2, is similar to the frequency regulation method used when the sampling point is at the location 1 between R1 and R2 shown in FIG. 1, and details are not described herein again.

Figure 8A:
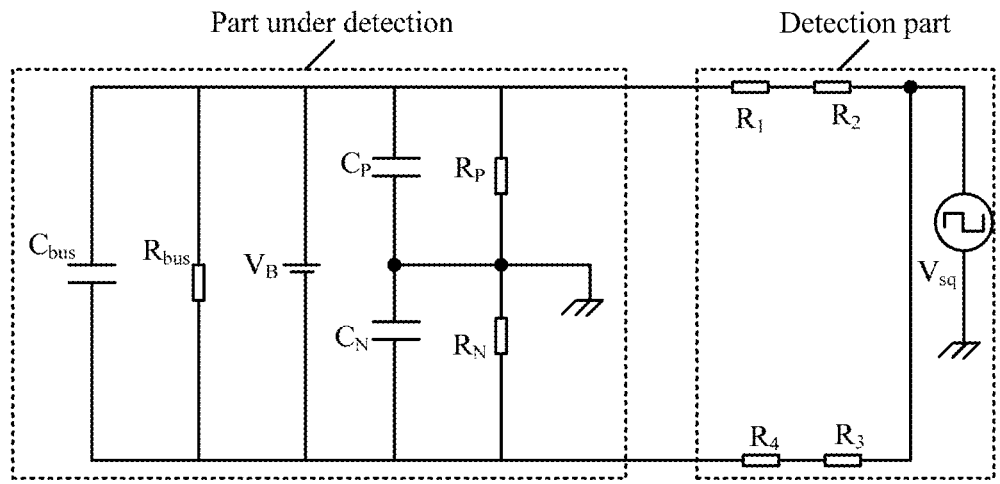
FIG. 8(*a*) shows an insulation impedance detection apparatus, in a direct current power system, to which an embodiment of the present disclosure may be applied.
Figure 8B:
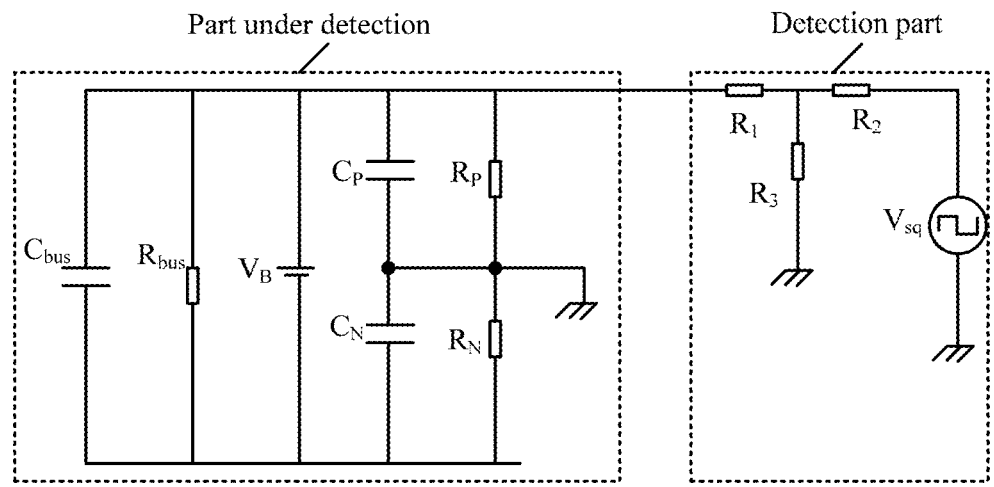

There are a plurality of manners for implementing the insulation impedance detection apparatus, which may be further shown in FIG. 8(a) and FIG. 8(b). A voltage frequency of a power supply may also be regulated by using the frequency regulation methods in the embodiments of the present disclosure. It should be noted that an application of the frequency regulation methods in the embodiments of the present disclosure is not limited to the insulation impedance detection apparatuses shown in FIG. 1, FIG. 8(a), and FIG. 8(b).

In actual application, a specific first function relationship may be further set based on a specific sampling point.

In addition, it should be noted that besides the foregoing embodiments, according to the frequency regulation methods in the embodiments of the present disclosure, a voltage frequency of a power supply may be further regulated depending on different detection precision requirements or different detection duration requirements.

For example, when a direct current power system is in an initial startup process and requires insulation impedance detection to respond quickly, to avoid a hazard caused by a poor insulation status during startup, a lower requirement for insulation impedance detection precision may be set, and detection duration may be required to be short enough. In this case, the voltage frequency of the power supply may be increased by adjusting values of k1 and k2 in the present disclosure. When the direct current power system is in a running process and insulation resistance is near an alarm value, to avoid erroneous reporting, a higher requirement for resistance detection precision may be set, and detection duration may be allowed to be prolonged. In this case, the voltage frequency of the power supply may be reduced by adjusting values of $k_1$ and $k_2$ in the present disclosure.

Based on a same inventive concept, an embodiment of the present disclosure further provides a frequency regulation apparatus. A method corresponding to the frequency regulation apparatus is the frequency regulation method in the embodiments of the present disclosure. Therefore, for implementation of the frequency regulation apparatus in this embodiment of the present disclosure, refer to implementation of the method, and repeated details are not described.

Figure 9:
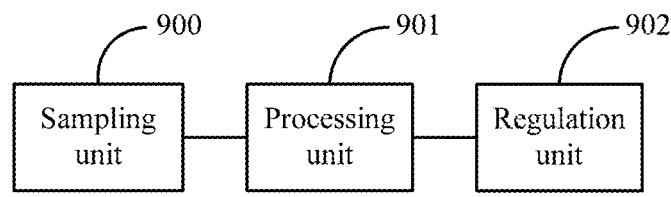
FIG. 9 is a schematic diagram of a frequency regulation apparatus according to an embodiment of the present disclosure.

As shown in FIG. 9, the frequency regulation apparatus in this embodiment of the present disclosure is applied to an insulation impedance detection apparatus in a direct current power system, and includes a sampling unit 900, a processing unit 901, and a regulation unit 902. The sampling unit 900 is configured to collect sampling voltages at a sampling point at at least three time points. The processing unit 901 is configured to determine a voltage frequency regulation manner based on the sampling voltages, obtained through sampling, at the at least three time points. The regulation unit 902 is configured to regulate a voltage frequency of a power supply in the insulation impedance detection apparatus according to the determined voltage frequency regulation manner.

Optionally, the processing unit 901 is specifically configured to: when the at least three sampling voltages obtained through sampling meet a first function relationship, determine that the voltage frequency regulation manner is maintaining the voltage frequency unchanged; when the at least three sampling voltages obtained through sampling do not meet the first function relationship but meet a second function relationship, determine that the voltage frequency regulation manner is increasing the voltage frequency by a specified first step; or when the at least three sampling voltages obtained through sampling do not meet the first function relationship but meet a third function relationship, determine that the voltage frequency regulation manner is reducing the voltage frequency by a specified second step.

Optionally, the sampling unit 900 is specifically configured to collect sampling voltages at the sampling point at three time points: a first sampling voltage at a first time point, a second sampling voltage at a second time point, and a third sampling voltage at a third time point.

Optionally, a voltage cycle of the power supply in the insulation impedance detection apparatus is T; and the sampling unit 900 is specifically configured to: collect a first sampling voltage at the sampling point at a time point zero of the voltage cycle, a second sampling voltage at the sampling point at a time point T/4 of the voltage cycle, and a third sampling voltage at the sampling point at a time point T/2 of the voltage cycle, or collect a first sampling voltage at the sampling point at a time point T/2 of the voltage cycle, a second sampling voltage at the sampling point at a time point 3T/4 of the voltage cycle, and a third sampling voltage at the sampling point at a time point T of the voltage cycle.

Optionally, the first function relationship is $$\frac{1}{2}(|V_3|+|V_1|)+\frac{k_2}{2}||V_3|-|V_1|| < |V_2| < \frac{1}{2}(|V_3|+|V_1|)+\frac{k_1}{2}||V_3|-|V_1||;$$

the second function relationship is $$|V_2| > \frac{1}{2}(|V_3|+|V_1|)+\frac{k_1}{2}||V_3|-|V_1||;$$

and the third function relationship is $$|V_2| < \frac{1}{2}(|V_3|+|V_1|)+\frac{k_2}{2}||V_3|-|V_1||,$$

where $V_1$ is the first sampling voltage, $V_2$ is the second sampling voltage, $V_3$ is the third sampling voltage, $k_1 \in (0,1)$, $k_2 \in (0,1)$, and $k_2 < k_1$.

Optionally, the first function relationship is $|V_3|-|V_2|>\Delta V_a$ and $|V_2|-|V_1|>\Delta V_b$; the second function relationship is $|V_3|-|V_2|<\Delta V_a$; and the third function relationship is $|V_2|-|V_0|<\Delta V_b$, where $V_1$ is the first sampling voltage, $V_2$ is the second sampling voltage, $V_3$ is the third sampling voltage, and $\Delta V_a$ and $\Delta V_b$ are constants that are not less than an absolute value of a detection error in voltage sampling.

The sampling unit 900, the processing unit 901, and the regulation unit 902 may be integrated into one microprocessor during specific hardware implementation, to regulate the voltage frequency of the power supply together. Alternatively, the sampling unit 900, the processing unit 901, and the regulation unit 902 each may be an analog circuit that can perform a corresponding function, or one or two of the sampling unit 900, the processing unit 901, and the regulation unit 902 are implemented by using an analog circuit with a corresponding function, and one of the three units is implemented by using a microprocessor.

Figure 10:
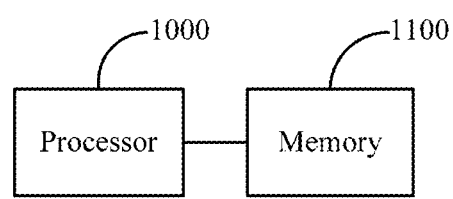
FIG. 10 is a schematic diagram of a hardware structure of a frequency regulation apparatus according to an embodiment of the present disclosure.

FIG. 10 is a schematic hardware apparatus diagram of an implementation of a frequency regulation apparatus according to an embodiment of the present disclosure. The frequency regulation apparatus includes a processor 1000 and a memory 1100. The processor 1000 may be a general purpose central processing unit (CPU), a microprocessor, an application-specific integrated circuit (ASIC), or one or more integrated circuits, configured to execute a related program to implement the technical solution provided in the embodiments of the present disclosure. The memory 1100 may be a read only memory (ROM), a static storage device, a dynamic storage device, or a random access memory (RAM). The memory 1100 may store an operating system, another application, and operational data. When the technical solution provided in the embodiments of the present disclosure is implemented by using software or firmware, program code used to implement the technical solution provided in the embodiments of the present disclosure is stored in the memory 1100, and is executed by the processor 1000.

In addition, depending on a specific requirement, persons skilled in the art should understand that the apparatus may further include a hardware component implementing another additional function. In addition, persons skilled in the art should understand that the device may alternatively include only a component or module necessary for implementing this embodiment of the present disclosure, and does not need to include all of the components shown in FIG. 10.

It may be learned from the foregoing content that the frequency regulation method in the embodiments of the present disclosure is applied to the insulation impedance detection apparatus in the direct current power system, and includes: collecting the sampling voltages at the sampling point at the at least three time points; determining the voltage frequency regulation manner based on the sampling voltages, obtained through sampling, at the at least three time points; and regulating the voltage frequency of the power supply in the insulation impedance detection apparatus according to the determined voltage frequency regulation manner. According to this technical solution, the voltage frequency regulation manner of the power supply can be determined based on the at least three sampling voltages obtained through sampling, and the voltage frequency of the power supply can be regulated according to the determined voltage frequency regulation manner, so that an obtained voltage cycle of the power supply is approximately equal to an insulation time constant of the insulation detection apparatus. Therefore, precision of insulation impedance obtained by using sampling voltages at a regulated voltage frequency is relatively high, insulation impedance detection duration is reduced, and the voltage frequency of the power supply can be dynamically regulated when the parasitic capacitance changes, thereby avoiding a problem in the prior art that in order to improve precision of insulation impedance calculation, the insulation impedance detection duration is prolonged by setting the voltage frequency of the power supply to a relatively small value.

Persons skilled in the art should understand that the embodiments of the present disclosure may be provided as a method, a system, or a computer program product. Therefore, the present disclosure may use a form of hardware only embodiments, software only embodiments, or embodiments with a combination of software and hardware. Moreover, the present disclosure may use a form of a computer program product that is implemented on one or more computer-usable storage media (including but not limited to a disk memory, a CD-ROM, an optical memory, and the like) that include computer-usable program code.

The present disclosure is described with reference to the flowcharts and/or block diagrams of the method, the device (system), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general purpose computer, a dedicated computer, an embedded processor, or a processor of another programmable data processing device to generate a machine, so that the instructions executed by the computer or the processor of another programmable data processing device generate an apparatus for implementing a specified function in one or more processes in the flowcharts and/or in one or more blocks in the block diagrams.

These computer program instructions may alternatively be stored in a computer readable memory that can instruct a computer or another programmable data processing device to work in a specific manner, so that the instructions stored in the computer readable memory generate an artifact that includes an instruction apparatus. The instruction apparatus implements a specified function in one or more processes in the flowcharts and/or in one or more blocks in the block diagrams.

These computer program instructions may alternatively be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specified function in one or more processes in the flowcharts and/or in one or more blocks in the block diagrams.

Although some embodiments of the present disclosure have been described, persons skilled in the art can make changes and modifications to these embodiments once they learn the basic inventive concept. Therefore, the following claims are intended to be construed as covering the embodiments and all changes and modifications falling within the scope of the present disclosure.

Obviously, persons skilled in the art can make various modifications and variations to the present disclosure without departing from the scope of the present disclosure. The present disclosure is intended to cover these modifications and variations made to the present disclosure, provided that they fall within the scope of protection defined by the following claims and their equivalent technologies.

What is claimed is:

1. A frequency regulation method, applied to an insulation impedance detection apparatus in a direct current power system, comprising:
    collecting sampling voltages at a sampling point for at least three time points;
    determining a voltage frequency regulation manner based on the at least three sampling voltages; and
    dynamically regulating a voltage frequency of a power supply in the insulation impedance detection apparatus according to the voltage frequency regulation manner to obtain a voltage cycle of the power supply equal to an insulation time constant of the insulation impedance detection apparatus.

2. The frequency regulation method of claim 1, wherein determining the voltage frequency regulation manner based on the at least three sampling voltages comprises:
    determining that the voltage frequency regulation manner is maintaining the voltage frequency unchanged when the at least three sampling voltages meet a first function relationship;

determining that the voltage frequency regulation manner is increasing the voltage frequency by a first step when the at least three sampling voltages do not meet the first function relationship but meet a second function relationship; or determining that the voltage frequency regulation manner is reducing the voltage frequency by a second step when the at least three sampling voltages do not meet the first function relationship but meet a third function relationship.

3. The frequency regulation method according to of claim 2, wherein the voltage cycle of the power supply in the insulation impedance detection apparatus is T, and wherein collecting sampling voltages at the sampling point for the at least three time points comprises:

collecting a first sampling voltage at a first sampling point at a time point zero of the voltage cycle, collecting a second sampling voltage at a second sampling point at a time point T/4 of the voltage cycle, and collecting a third sampling voltage at a third sampling point at a time point T/2 of the voltage cycle, or collecting a first sampling voltage at a first sampling point at a time point T/2 of the voltage cycle, collecting a second sampling voltage at a second sampling point at a time point 3T/4 of the voltage cycle, and collecting a third sampling voltage at a third sampling point at a time point T of the voltage cycle.

4. The frequency regulation method of claim 3, wherein the first function relationship is $$\frac{1}{2}(|V_3|+|V_1|)+\frac{k_2}{2}||V_3|-|V_1|| < |V_2| < \frac{1}{2}(|V_3|+|V_1|)+\frac{k_1}{2}||V_3|-|V_1||,$$

wherein the second function relationship is $$|V_2| > \frac{1}{2}(|V_3|+|V_1|)+\frac{k_1}{2}||V_3|-|V_1||,$$

wherein the third function relationship is $$|V_2| < \frac{1}{2}(|V_3|+|V_1|)+\frac{k_2}{2}||V_3|-|V_1||,$$

wherein $V_1$ is the first sampling voltage, wherein $V_2$ is the second sampling voltage, wherein $V_3$ is the third sampling voltage, wherein $k_1 \in (0,1)$, wherein $k_2 \in (0,1)$, and wherein $k_2 < k_1$.

5. The frequency regulation method of claim 3, wherein the first function relationship is $|V_3|-|V_2|>\Delta V_a$ and $|V_2|-|V_1|>\Delta V_b$, wherein the second function relationship is $|V_3|-|V_2|<\Delta V_a$, wherein the third function relationship is $|V_2|-|V_1|<\Delta V_b$, wherein $V_1$ is the first sampling voltage, wherein $V_2$ is the second sampling voltage, wherein $V_3$ is the third sampling voltage, and wherein $\Delta V_a$ and $\Delta V_b$ are constants.

6. A frequency regulation apparatus, applied to an insulation impedance detection apparatus in a direct current power system, comprising:

a sampling unit configured to collect sampling voltages at a sampling point for at least three time points;

a processing unit configured to determine a voltage frequency regulation manner based on the at least three sampling voltages; and a regulation unit configured to dynamically regulate a voltage frequency of a power supply in the insulation impedance detection apparatus according to the voltage frequency regulation manner to obtain a voltage cycle of the power supply equal to an insulation time constant of the insulation impedance detection apparatus.

7. The frequency regulation apparatus of claim 6, wherein the processing unit is further configured to:

determine that the voltage frequency regulation manner is to maintain the voltage frequency unchanged when the at least three sampling voltages meet a first function relationship;

determine that the voltage frequency regulation manner is to increase the voltage frequency by a first step when the at least three sampling voltages do not meet the first function relationship but meet a second function relationship; or determine that the voltage frequency regulation manner is to reduce the voltage frequency by a second step when the at least three sampling voltages do not meet the first function relationship but meet a third function relationship.

8. The frequency regulation apparatus of claim 7, wherein the voltage cycle of the power supply in the insulation impedance detection apparatus is T, and wherein the sampling unit is further configured to:

collect a first sampling voltage at a first sampling point at a time point zero of the voltage cycle, collect a second sampling voltage at a second sampling point at a time point T/4 of the voltage cycle, and collect a third sampling voltage at a third sampling point at a time point T/2 of the voltage cycle, or collect a first sampling voltage at a first sampling point at a time point T/2 of the voltage cycle, a second sampling voltage at a second sampling point at a time point 3T/4 of the voltage cycle, and a third sampling voltage at a third sampling point at a time point T of the voltage cycle.

9. The frequency regulation apparatus of claim 8, wherein the first function relationship is $$\frac{1}{2}(|V_3|+|V_1|)+\frac{k_2}{2}||V_3|-|V_1|| < |V_2| < \frac{1}{2}(|V_3|+|V_1|)+\frac{k_1}{2}||V_3|-|V_1||$$

wherein the second function relationship is $$|V_2| > \frac{1}{2}(|V_3|+|V_1|)+\frac{k_1}{2}||V_3|-|V_1||,$$

wherein the third function relationship is $$|V_2| < \frac{1}{2}(|V_3|+|V_1|)+\frac{k_2}{2}||V_3|-|V_1||,$$

wherein $V_1$ is the first sampling voltage, wherein $V_2$ is the second sampling voltage, wherein $V_3$ is the third sampling voltage, wherein $k_1 \in (0,1)$, wherein $k_2 \in (0,1)$, and wherein $k_2 < k_1$.

10. The frequency regulation apparatus of claim 8, wherein the first function relationship is $|V_3|-|V_2|>\Delta V_a$ and $|V_2|-|V_1|>\Delta V_b$, wherein the second function relationship is $|V_3|-|V_2|>\Delta V_a$, wherein the third function relationship is $|V_2|-|V_1|<\Delta V_b$, wherein $V_1$ is the first sampling voltage, wherein $V_2$ is the second sampling voltage, wherein $V_3$ is the third sampling voltage, and wherein $\Delta V_a$ and $\Delta V_b$ are constants.

11. A frequency regulation apparatus, applied to an insulation impedance detection apparatus in a direct current power system, comprising:
a memory comprising instructions; and
a processor coupled to the memory and configured to execute the instructions, which cause the processor to be configured to:
collect sampling voltages at a sampling point for at least three time points;
determine a voltage frequency regulation manner based on the at least three sampling voltages; and
dynamically regulate a voltage frequency of a power supply in the insulation impedance detection apparatus according to the voltage frequency regulation manner to obtain a voltage cycle of the power supply equal to an insulation time constant of the insulation impedance detection apparatus.

12. The frequency regulation apparatus of claim 11, wherein the processor is further configured to:
determine that the voltage frequency regulation manner is maintaining the voltage frequency unchanged when the at least three sampling voltages meet a first function relationship.

13. The frequency regulation apparatus of claim 12, wherein the processor is further configured to:
determine that the voltage frequency regulation manner is increasing the voltage frequency by a first step when the at least three sampling voltages do not meet the first function relationship but meet a second function relationship.

14. The frequency regulation apparatus of claim 12, wherein the processor is further configured to:
determine that the voltage frequency regulation manner is reducing the voltage frequency by a second step when the at least three sampling voltages do not meet the first function relationship but meet a third function relationship.

15. The frequency regulation apparatus of claim 11, wherein the voltage cycle of the power supply in the insulation impedance detection apparatus is T.

16. The frequency regulation apparatus of claim 15, wherein the processor is further configured to collect a first sampling voltage at a first sampling point at a time point zero of the voltage cycle, collect a second sampling voltage at a second sampling point at a time point T/4 of the voltage cycle, and collect a third sampling voltage at a third sampling point at a time point T/2 of the voltage cycle.

17. The frequency regulation apparatus of claim 15, wherein the processor is further configured to collect a first sampling voltage at a first sampling point at a time point T/2 of the voltage cycle, collect a second sampling voltage at a second sampling point at a time point 3T/4 of the voltage cycle, and collect a third sampling voltage at a third sampling point at a time point T of the voltage cycle.

18. The frequency regulation apparatus of claim 11, wherein the processor is further configured to regulate the voltage frequency of the power supply in the insulation impedance detection apparatus further according to detection precision requirements.

19. The frequency regulation apparatus of claim 11, wherein the processor is further configured to regulate the voltage frequency of the power supply in the insulation impedance detection apparatus further according to detection duration requirements.

20. The frequency regulation apparatus of claim 11, wherein the at least three time points of the sampling point are set depending on a requirement.

* * * * *

UNITED STATES PATENT AND TRADEMARK OFFICE
CERTIFICATE OF CORRECTION

PATENT NO. : 11,150,284 B2  
APPLICATION NO. : 16/137126  
DATED : October 19, 2021  
INVENTOR(S) : Rui Yang, Zhiwei Wu and Wei Mo Page 1 of 1

It is certified that error appears in the above-identified patent and that said Letters Patent is hereby corrected as shown below:

In the Claims

Claim 10, Column 16, Line 66: "$|V_3|-|V_2|>\Delta V_a$" should read "$|V_3|-|V_2|<\Delta V_a$"

Signed and Sealed this  
Fourteenth Day of December, 2021

Drew Hirshfeld  
*Performing the Functions and Duties of the*  
*Under Secretary of Commerce for Intellectual Property and*  
*Director of the United States Patent and Trademark Office*